US012700714B2

(12) United States Patent
Hahl et al.

(10) Patent No.: US 12,700,714 B2
(45) Date of Patent: Aug. 4, 2026

(54) METHOD FOR OPERATING A CONTROL AND MONITORING DEVICE FOR A ROTATING LASER, THE CONTROL AND MONITORING DEVICE, AND THE ROTATING LASER

(71) Applicant: Robert Bosch GmbH, Stuttgart (DE)

(72) Inventors: Markus Hahl, Korntal-Muenchingen (DE); Andrej Albrecht, Leinfelden-Echterdingen (DE); Tobias Zibold, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 921 days.

(21) Appl. No.: 17/990,189

(22) Filed: Nov. 18, 2022

(65) Prior Publication Data

US 2023/0170669 A1     Jun. 1, 2023

(30) Foreign Application Priority Data

Nov. 30, 2021    (DE) ..................... 10 2021 213 460.2

(51) Int. Cl.
*H01S 5/06* (2006.01)

(52) U.S. Cl.
CPC ..................................... *H01S 5/06* (2013.01)

(58) Field of Classification Search
CPC .......... H01S 5/06; H01S 3/101; H01S 3/0014; H01S 3/10; H01S 5/0014; H01S 5/06243; G01C 15/004; G02B 26/0816; G02B 26/0883
See application file for complete search history.

(56) References Cited

U.S. PATENT DOCUMENTS

| | | | |
|---|---|---|---|
| 5,953,108 A | 9/1999 | Falb et al. | |
| 2002/0176087 A1* | 11/2002 | Numai ................... | G01C 19/66 |
| | | | 356/461 |
| 2012/0187868 A1* | 7/2012 | Winter ................. | G01C 15/004 |
| | | | 315/307 |
| 2014/0283397 A1* | 9/2014 | Fessler ................... | G01B 11/26 |
| | | | 33/285 |
| 2016/0315703 A1 | 10/2016 | Dumoulin et al. | |

FOREIGN PATENT DOCUMENTS

| | | |
|---|---|---|
| DE | 10 2010 031 634 A1 | 1/2012 |
| DE | 10 2010 061 726 A1 | 5/2012 |
| DE | 10 2016 200 188 A1 | 7/2016 |
| EP | 2 410 292 A2 | 1/2012 |
| JP | 3854486 B2 | 9/2006 |
| WO | 2012/062746 A1 | 5/2012 |

* cited by examiner

*Primary Examiner* — Michael E Teitelbaum
(74) *Attorney, Agent, or Firm* — Maginot, Moore & Beck LLP

(57) ABSTRACT

The disclosure proceeds from a method for operating a control and monitoring device for a rotating laser, wherein in one method step, a laser power of a laser unit of the rotating laser is controlled as a function of a rotational speed of a rotating head of the rotating laser by means of a control or regulating unit of the control and monitoring device. By means of a further control or regulating unit of the control and monitoring device, the rotational speed of the rotating head and at least one operating parameter of the laser unit is interrogated and adjusted in order to emit a signal for influencing a laser beam that can be emitted by means of the laser unit.

12 Claims, 3 Drawing Sheets

FIG. 2

METHOD FOR OPERATING A CONTROL AND MONITORING DEVICE FOR A ROTATING LASER, THE CONTROL AND MONITORING DEVICE, AND THE ROTATING LASER

This application claims priority under 35 U.S.C. § 119 to patent application no. DE 10 2021 213 460.2, filed on Nov. 30, 2021 in Germany, the disclosure of which is incorporated herein by reference in its entirety.

BACKGROUND

A method for operating a control and monitoring device for a rotating laser, wherein in one method step, a laser power of a laser unit of the rotating laser is controlled as a function of a rotational speed of a rotating head of the rotating laser by means of a control or regulating unit of the control and monitoring device, has already been proposed.

SUMMARY

The disclosure proceeds from a method for operating a control and monitoring device for a rotating laser, wherein in one method step, a laser power of a laser unit of the rotating laser is controlled as a function of a rotational speed of a rotating head of the rotating laser by means of a control or regulating unit of the control and monitoring device.

It is proposed that by means of a further control or regulating unit of the control and monitoring device, the rotational speed of the rotating head and at least one operating parameter of the laser unit is interrogated and adjusted in order to emit a signal for influencing a laser beam that can be emitted by means of the laser unit.

The control or regulating unit comprises in particular at least one processor and one memory element, and an operating program stored in the memory element. The memory element is preferably designed as a digital storage medium, for example as a hard drive or the like. The control or regulating unit is preferably designed as a microcontroller or as another control or regulating unit that appears expedient to a person skilled in the art. The rotating laser preferably comprises at least one drive unit for driving the rotating head. The drive unit is preferably designed as an electric motor or the like. The laser unit is preferably, in particular at least partially, arranged on the rotating head. Preferably, the rotating head comprises at least one deflection element, for example a mirror, a prism, or the like, which is provided to deflect the laser beam that can be emitted by means of the laser unit, in such a way, in particular by 90°, that by rotating the rotating head, the laser beam is emitted in an angular range, in particular of more than 15°, preferably of more than 75°, particularly preferably of more than 180°, and most preferably of 360°, about an axis of rotation of the rotating head. Preferably, the rotational speed of the rotating head is controlled or regulated by means of the control or regulating unit, preferably via a control or regulation of the drive unit by the control or regulating unit.

Preferably, a rotational speed, in particular a target rotational speed, of the rotating head is set via an input unit, which is connected to the control or regulating unit in particular by control or regulation technology, preferably by data technology, for example in a wired or wireless manner. It is conceivable that the input unit comprises a keypad, a control dial, a touch screen, a slider, a remote control, or the like. It is conceivable that the control and monitoring device or the rotating laser comprises the input unit. For example, a rotational speed, in particular a target rotational speed, of the rotating head is set by an input of a user via the input unit. It is also conceivable that the rotational speed, in particular a target rotational speed, of the rotating head is automatically set by means of the control or regulating unit.

The actual rotational speed, in particular an instantaneous rotational speed, of the rotating head is in particular interrogated and/or determined by means of the control or regulating unit. For example, the rotational speed, in particular the instantaneous rotational speed, of the rotating head is interrogated and/or determined directly at the rotating head or is determined as a function of a rotational speed interrogated by means of the control or regulating unit, in particular an instantaneous rotational speed, of the drive unit. In particular, an operating mode of the rotating head can be determined as a function of a rotational speed of the rotating head, preferably of the drive unit. Preferably, the operating mode of the rotating head may be a stoppage of the rotating head, a rotation of the rotating head at different rotational speeds, e.g., 150 rpm, 300 rpm, 600 rpm, 1200 rpm, or other rotational speeds, i.e., rotational speeds that appear expedient to a person skilled in the art, a rotation direction of a rotation of the rotating head, or the like. Preferably, a laser power, in particular a target laser power, of the laser unit is set by means of the control or regulating unit as a function of the determined rotational speed, in particular the instantaneous rotational speed, preferably the determined operating mode, of the rotating head. Alternatively, it is also conceivable that the laser power, in particular the target laser power, is set by means of the control or regulating unit directly as a function of a setting made for the rotational speed, in particular the target rotational speed, of the rotating head.

The laser unit preferably comprises a laser diode. The laser unit preferably comprises at least one driver circuit in order to excite the laser diode. Preferably, the driver circuit is configured to electrically excite the laser diode. Alternatively, it is also conceivable that the driver circuit may be configured to optically pump the laser. Alternatively, it is also conceivable that the laser unit comprises a gas laser, a dye laser, or a solid-state laser different from the laser diode. Preferably, the laser power, in particular the target laser power, of the laser unit is set by means of the control or regulating unit as a function of the determined rotational speed, in particular the instantaneous rotational speed, of the rotating head in such a way that a maximum value of the laser power is within a target limit value range, which is preferably stored in the memory element of the control or regulating unit, for the laser power at the corresponding rotational speed, in particular the instantaneous rotational speed, of the rotating head. The target limit value range for the laser power preferably depends on a rotational speed, in particular an instantaneous rotational speed, of the rotating head, in particular on the operating mode of the rotating head. For example, the target limit value range is predetermined by safety regulations for operating a laser. It is conceivable that the driver circuit is designed to be different from the control or regulating unit. It is alternatively also conceivable that the driver circuit is integrated into the control or regulating unit, in particular that the driver circuit and the control or regulating unit are arranged on a common board. Furthermore, it is also conceivable that the laser unit comprises at least one laser-power measuring element for detecting a laser power, in particular an instantaneous laser power, of a laser beam that can be emitted by means of the laser unit. The laser-power measuring element is preferably designed as a diode or as another element that appears expedient to a person skilled in the art to determine a laser power, in particular an instantaneous laser power, of a laser beam. For example, by means of the laser power element designed as a diode, a laser power, in particular an instantaneous laser power, of the laser beam that can be generated by means of the laser unit is determined via a photocurrent generated therewith in the diode. It is additionally or alternatively conceivable that the control or regulating unit controls the laser power, in particular the target laser power, as a function of the laser power detected by means of the laser-power measuring element, in particular the instantaneous laser power, of the laser unit.

The further control or regulating unit is preferably designed as a microcontroller or as another control or regulating unit that appears expedient to a person skilled in the art. The further control or regulating unit is preferably designed to be different from the control or regulating unit. Alternatively, it is also conceivable that the control or regulating unit and the further control or regulating unit are arranged on a common board. Preferably, the control or regulating unit and the further control or regulating unit comprise operating programs different from one another. The rotational speed, in particular the instantaneous rotational speed, of the rotating head is in particular interrogated and/or determined by means of the further control or regulating unit. It is conceivable that the rotational speed, in particular the instantaneous rotational speed, of the rotating head is interrogated and/or determined by means of the further control or regulating unit directly at the rotating head or is determined by means of the further control or regulating unit as a function of an interrogation of the rotational speed, in particular the instantaneous rotational speed, of the drive unit. Preferably, the rotational speed, in particular the instantaneous rotational speed, of the rotating head is determined by means of the further control or regulating unit independently of the control or regulating unit. In particular, the rotational speed, in particular the instantaneous rotational speed, of the rotating head is determined by means of the control or regulating unit and the further control or regulating unit, preferably independently of one another and/or in two different ways, e.g., by means of different sensors.

Preferably, the further control or regulating unit is connected to the laser unit by control or regulation technology, preferably by data technology, in particular in a wired or wireless manner. Preferably, a laser power, in particular a target laser power and/or an instantaneous laser power, of the laser unit is determined by means of the further control or regulating unit as a function of the at least one operating parameter of the laser unit. The further control or regulating unit preferably adjusts the laser power interrogated and/or determined by means of the further control or regulating unit, in particular the target laser power and/or the instantaneous laser power, of the laser unit with the rotational speed interrogated and/or determined by means of the further control or regulating unit, in particular the instantaneous rotational speed, of the rotating head. Preferably, the further control or regulating unit checks whether a maximum value of the laser power interrogated and/or determined by means of the further control or regulating unit, in particular the target laser power and/or instantaneous laser power, of the laser unit is within the target limit value range, which is preferably stored in a memory element of the further control or regulating unit, for the laser power, in particular the instantaneous laser power, at the corresponding rotational speed, in particular the instantaneous rotational speed, of the rotating head. In particular, the signal for influencing a laser beam that can be emitted by means of the laser unit is emitted by means of the further control or regulating unit if a maximum value of the laser power determined by means of the further control or regulating unit, in particular the target laser power and/or instantaneous laser power, of the laser beam that can be emitted by means of the laser unit is outside the target limit value range for the laser power at the corresponding rotational speed, in particular the instantaneous rotational speed, of the rotating head.

The signal for influencing a laser beam that can be emitted by means of the laser unit is in particular a signal for controlling or regulating the laser unit, in particular the driver circuit of the laser unit, of a power supply of the laser unit and/or of the laser diode of the laser unit, or a signal for directly influencing the laser beam that can be emitted by means of the laser unit, for example in order to activate a blocking or deflection unit of the control and monitoring device to block and/or deflect the laser beam or the like. Preferably, by means of the signal for influencing a laser beam that can be emitted by means of the laser unit, a laser power, in particular a target laser power and/or an instantaneous laser power, of the laser unit is changed, preferably reduced, the laser unit is deactivated and/or a propagation of the laser beam that can be emitted by means of the laser unit is counteracted. Preferably, by means of the signal for influencing the laser beam that can be emitted by means of the laser unit, the laser power, in particular the target laser power and/or the instantaneous laser power, is changed, e.g., reduced or increased, in such a way that a maximum value of the laser power, in particular of the instantaneous laser power, is within the target limit value range for the laser power at the corresponding rotational speed, in particular the instantaneous rotational speed, of the rotating head. It is conceivable that the signal for influencing a laser beam that can be emitted by means of the laser unit is emitted as a function of only one operating parameter of the laser unit or of a plurality of operating parameters of the laser unit.

Particularly high personal protection during the operation of a rotating laser can advantageously be realized by the design according to the disclosure of the control and monitoring device. Advantageously, redundant control of a laser unit can be provided as a function of a rotational speed, in particular of an instantaneous rotational speed, of a rotating head. Advantageously, fail-safe operation of the control and monitoring device for a rotating laser can be realized. A single-fail-safety of the control and monitoring device can advantageously be made possible in a reliable and constructively simple manner.

Furthermore, it is proposed that an operating parameter of the laser unit designed as a laser power setting made by the control or regulating unit, in particular a target laser power, or a laser power that can be emitted by the laser unit, in particular an instantaneous laser power, is interrogated by means of the further control or regulating unit. Alternatively, it is also conceivable that the operating parameter is an instantaneous operating parameter of the laser unit or the like. It is conceivable that the laser power that can be emitted by means of the laser unit, in particular the instantaneous laser power, is detected via the laser-power measuring element of the laser unit and is interrogated by the further control or regulating unit. Alternatively or additionally, it is also conceivable that the further control or regulating unit and/or the laser unit comprises a further laser-power measuring element, e.g., a further diode or the like, for detecting a laser power, in particular an instantaneous laser power, of a laser beam that can be emitted by means of the laser unit. The laser power setting made by the control or regulating unit is, for example, designed as a control or regulated voltage, as digital control or regulation information, or the like. Advantageously, particularly reliable monitoring and control of a laser beam that can be emitted by means of a laser unit can be realized. Advantageously, operation of a laser unit outside of a provided power range can be counteracted in a particularly safe and efficient manner. Advantageously, particularly high occupational safety can be realized for persons in an effective range of a rotating laser.

It is furthermore proposed that a blocking and/or deflection unit of the control and monitoring device, in particular the aforementioned one, is activated to block or deflect the laser beam that can be emitted by means of the laser unit, as a function of the signal that can be emitted by means of the further control or regulating unit. Preferably, the further control or regulating unit is connected to the blocking and/or deflection unit by control or regulation technology, in particular by data technology, preferably in a wireless or wired manner, preferably in order to transfer the signal for influencing the laser beam that can be emitted by means of the laser unit, to the blocking and/or deflection unit in order to control or regulate the blocking and/or deflection unit. In particular, the blocking and/or deflection unit comprises at least one blocking element and/or at least one deflection element. The blocking element is in particular designed as a flap, as an aperture, or as another element that appears expedient to a person skilled in the art to block a laser beam. For example, as a function of the signal that can be emitted by means of the further control or regulating unit in order to influence the laser beam that can be emitted by means of the laser unit, the at least one blocking element is brought into a beam path of the laser beam that can be emitted by means of the laser unit, in order to block the laser beam. For example, the deflection element is designed as a mirror, as a prism, or as another element that appears expedient to a person skilled in the art to deflect a laser beam. For example, as a function of the signal that can be emitted by means of the further control or regulating unit in order to influence the laser beam that can be emitted by means of the laser unit, the at least one deflection element is brought into the beam path of the laser beam that can be emitted by means of the laser unit, in order to deflect the laser beam. Preferably, the laser beam that can be emitted by means of the laser unit is blocked and/or deflected by means of the blocking and/or deflection unit, in particular by means of the at least one deflection element and/or the at least one blocking element, in an activated state of the blocking and/or deflection unit in such a way that the laser beam is prevented from radiating to an environment of the rotating laser. The blocking and/or deflection unit, in particular the at least one blocking element and/or the at least one deflection element, are preferably arranged on the laser unit, preferably on the laser diode of the laser unit. Advantageously, a particularly simple and safe intervention in a laser unit, in particular a beam path of the laser beam, in order to prevent a laser beam that is not emitted properly by means of the laser unit can be realized. Advantageously, a protective function can be checked particularly easily.

In addition, it is proposed that at least one operating parameter, in particular an instantaneous operating parameter, of the control or regulating unit is interrogated by means of the further control or regulating unit in order to emit, by means of the further control or regulating unit, the signal for influencing the laser beam that can be emitted by means of the laser unit, at least as a function of the at least one operating parameter, in particular the instantaneous operating parameter, of the control or regulating unit. It is conceivable that the signal for influencing a laser beam that can be emitted by means of the laser unit depends on the at least one operating parameter of the laser unit, additionally or alternatively on the at least one operating parameter, in particular the instantaneous operating parameter, of the control or regulating unit. In particular, the at least one operating parameter, in particular the instantaneous operating parameter, of the control or regulating unit is an operating parameter of the control or regulating unit that influences the laser power, in particular the instantaneous laser power. It is furthermore conceivable that the signal for influencing a laser beam that can be emitted by means of the laser unit alternatively or additionally depends on at least one further operating parameter, in particular an instantaneous operating parameter, of a further component of the control and monitoring device and/or of a further component of the rotating laser, wherein the further operating parameter, in particular the instantaneous operating parameter, preferably influences a laser power that can be emitted by means of the laser unit, preferably an instantaneous laser power. Advantageously, a laser power that can be emitted by means of the laser unit can be checked particularly flexibly and safely. Advantageously, operation of the laser unit with a laser power, in particular an instantaneous laser power, outside of a target limit value range for the laser power can be counteracted particularly efficiently and early. Advantageously, a particularly single-fail-safe operation of the rotating laser can be realized.

It is furthermore proposed that a sensor signal of a movement sensor of a sensor unit of the rotating laser is interrogated by means of the control or regulating unit and a sensor signal of a further movement sensor of the sensor unit is interrogated by means of the further control or regulating unit, wherein an operating mode, in particular the aforementioned one, in particular an operating mode defined by a rotational speed, preferably an instantaneous rotational speed, and/or by a rotation direction, of the rotating head is determined as a function of an evaluation of a temporal change of the sensor signals interrogated by the control or regulating unit and the further control or regulating unit. Preferably, the movement sensor is designed to be different from the further movement sensor. Preferably, the movement sensor and the further movement sensor are based on different measurement methods for detecting a rotational speed, in particular an instantaneous rotational speed. It is also conceivable that the movement sensor and the further movement sensor are designed identically, in particular based on identical measurement methods for detecting a rotational speed. The movement sensor and/or the further movement sensor are/is, for example, designed as an optical encoder, as magnetic field sensor(s), or the like. Alternatively, it is also conceivable that the movement sensor and/or the further movement sensor are/is designed as acoustic sensor(s) or as other sensor(s) that appear expedient to a person skilled in the art to detect a rotational speed, in particular an instantaneous rotational speed. The sensor unit, in particular the movement sensor and/or the further movement sensor, is/are arranged on the drive unit and/or on the rotating head. Preferably, the operating mode, in particular the rotational speed, preferably the instantaneous rotational speed, of the rotating head is determined as a function of an evaluation of a temporal change of the sensor signal of the movement sensor interrogated by the control or regulating unit, independently of a determination of the operating mode, in particular of the rotational speed, preferably of the instantaneous rotational speed, of the rotating head as a function of an evaluation of a temporal change of the sensor signal of the further movement sensor interrogated by the further control or regulating unit. Advantageously, a rotational speed, in particular the instantaneous rotational speed, of the rotating head can be determined particularly reliably. Advantageously, a detected value for a rotational speed, in particular an instantaneous rotational speed, can be double-checked particularly easily and efficiently. Advantageously, an undesirable setting of a laser power can be counteracted particularly efficiently and precisely. Advantageously, particularly safe operation of a rotating laser can be ensured.

Furthermore, it is proposed that at least one operating parameter, preferably an instantaneous operating parameter, in particular a voltage characteristic variable, of an amplifier, in particular of an operational amplifier, of the laser unit is interrogated by means of the further control or regulating unit in order to emit, by means of the further control or regulating unit, at least as a function of the at least one operating parameter of the amplifier, the signal for influencing the laser beam that can be emitted by means of the laser unit. It is conceivable that the signal for influencing a laser beam that can be emitted by means of the laser unit depends on the operating parameter of the laser unit designed as a laser power setting made by the control or regulating unit, in particular the target laser power, or as a laser power that can be emitted by the laser unit, in particular the instantaneous laser power, additionally or alternatively on the at least one operating parameter of the amplifier and/or on the at least one operating parameter of the control or regulating unit. The voltage characteristic variable is preferably a voltage level or the like. Preferably, the voltage characteristic variable is measured at an output of the amplifier. It is conceivable that the amplifier is implemented as an integrated circuit. In particular, a laser power, in particular the instantaneous laser power, of a laser beam that can be emitted by means of the laser unit depends on the voltage characteristic variable, in particular the voltage level, preferably at the output, of the amplifier. It is also conceivable that the signal for influencing the signal that can be emitted by means of the laser unit depends only on the operating parameter designed as a laser power setting made by the control or regulating unit, in particular a target laser power, of the laser unit, on the operating parameter designed as a laser power that can be emitted by the laser unit, in particular the instantaneous laser power, of the laser unit, on the at least one operating parameter of the control or regulating unit or only on the at least one operating parameter of the amplifier of the laser unit 16. Advantageously, operation of the laser unit outside a target limit value range as a result of a fault of an amplifier of the laser unit can be counteracted. Advantageously, a particularly safe operation of a rotating laser can be realized.

Furthermore, the disclosure proceeds from a control and monitoring device, in particular the aforementioned one, for a rotating laser, in particular the aforementioned one, which device is configured to control a laser power of a laser unit, in particular the aforementioned one, of the rotating laser as a function of an operating mode of a rotating head, in particular the aforementioned one, of the rotating laser, in particular according to a method according to the disclosure, with at least one control or regulating unit, in particular the aforementioned one, which is configured to control the laser power, in particular the target laser power, of the laser unit as a function of a rotational speed, in particular an instantaneous rotational speed, of the rotating head. It is proposed that the control and monitoring device comprises a further control or regulating unit, in particular the aforementioned one, which is configured to interrogate and adjust, in particular independently of the control or regulating unit, the rotational speed, in particular the instantaneous rotational speed, of the rotating head and at least one operating parameter of the laser unit in order to emit a signal for influencing a laser beam that can be emitted by means of the laser unit, in particular in order to deactivate the laser unit. Preferably, the control or regulating unit and the further control or regulating unit are arranged on, preferably in, a common housing of the control and monitoring device. Advantageously, a control and monitoring device that supports particularly safe operation of a laser unit of a rotating laser can be provided. Advantageously, injury to persons in an effective range of the rotating laser as a result of too high a laser power can be counteracted particularly efficiently and reliably.

In addition, it is proposed that the control and monitoring device comprises a connection unit that connects the further control or regulating unit to the laser unit by control or regulation technology for the purpose of interrogating the at least one operating parameter of the laser unit. The connection unit is provided in particular for a wired connection of the further control or regulating unit to the laser unit, in particular to the driver circuit and/or the laser diode. For example, the connection unit comprises at least one connection element designed, for example, as a cable, a plug, a socket, or the like, in order to establish a connection by control or regulation technology between the further control or regulating unit and the laser unit. Alternatively or additionally, it is also conceivable that the connection unit is provided for a wireless connection of the further control or regulating unit to the laser unit, in particular the driver circuit and/or the laser diode. For example, a respective transceiver or the like of the connection unit is arranged on the further control or regulating unit and on the laser unit, which transceivers are in particular provided to communicate with one another in order to control or regulate the laser unit and/or to transmit the at least one operating parameter of the laser unit. Advantageously, a laser unit can be influenced independently of a control or regulating unit provided to control or regulate the laser unit and can in particular be deactivated when the laser unit operates outside a target limit value range for the laser power. Advantageously, particularly high safety can be realized for persons in an effective range of a rotating laser.

Furthermore, it is proposed that the control and monitoring device comprises a blocking and/or deflection unit, in particular the aforementioned one, for blocking and/or deflecting the laser beam that can be emitted by means of the laser unit, which blocking and/or deflection unit can be activated by the signal that can be emitted by the further control or regulating unit.

Advantageously, particularly high occupational safety can be realized in a particularly simple and reliably checkable manner.

In addition, a rotating laser, in particular the aforementioned one, with at least one laser unit, in particular the aforementioned one, with at least one rotating head, in particular the aforementioned one, with at least one drive unit, in particular the aforementioned one, for driving the rotating head, and with at least one control or monitoring device according to the disclosure is proposed. Preferably, the rotating laser comprises at least one housing, on, in particular in, which preferably the laser unit, the rotating head and/or the drive unit are/is arranged. It is conceivable that the housing of the rotating laser corresponds to the housing of the control and monitoring device. Alternatively, it is also conceivable that the housing of the rotating laser is different from the housing of the control and monitoring device. Furthermore, it is conceivable that the rotating laser comprises a leveling unit for orienting the rotating head and/or the laser unit. The leveling unit preferably comprises at least one sensor, e.g., an acceleration sensor or the like, in order to determine a position, preferably an inclination, of the rotating head and/or of the laser unit relative to a perpendicular. In particular, the leveling unit comprises at least one actuator for orienting the laser unit and/or the rotating head, in particular as a function of a position determined by means of the sensor, preferably an inclination, of the laser unit and/or of the rotating head relative to the perpendicular. Advantageously, a rotating laser that enables particularly high and reliable protection of persons in an effective range of the rotating laser can be provided.

It is furthermore proposed that the rotating laser comprises a sensor unit, in particular the aforementioned one, which comprises at least two movement sensors, in particular ones that are different from one another, preferably the aforementioned ones, which are arranged on the drive unit or on the rotating head in order to detect the rotational speed, in particular the instantaneous rotational speed, of the rotating head. Preferably, the aforementioned movement sensor and the further movement sensor correspond to the two movement sensors. Advantageously, a value for the rotational speed, in particular the instantaneous rotational speed, can be checked particularly reliably. Advantageously, a particularly precise and safe control of the laser unit can be achieved as a function of the rotational speed, in particular the instantaneous rotational speed, of the rotating head.

The method according to the disclosure, the control and monitoring device according to the disclosure and/or the rotating laser according to the disclosure is/are not to be limited to the application and embodiment described above. In order to fulfill a functionality described herein, the method according to the disclosure and/or the control and monitoring device according to the disclosure and/or the rotating laser according to the disclosure can in particular comprise a number of individual elements, components, units, and method steps that deviate from a number mentioned herein. Moreover, in the case of the value ranges specified in this disclosure, values within the mentioned limits are also to be considered as disclosed and usable as desired.

BRIEF DESCRIPTION OF THE DRAWINGS

Further advantages become apparent from the following description of the drawing. The drawing shows an exemplary embodiment of the disclosure. The drawing, the description and the disclosure contain numerous features in combination. The person skilled in the art will expediently also consider the features individually and combine them into meaningful further combinations.

Shown are.

DETAILED DESCRIPTION

Figure 1:
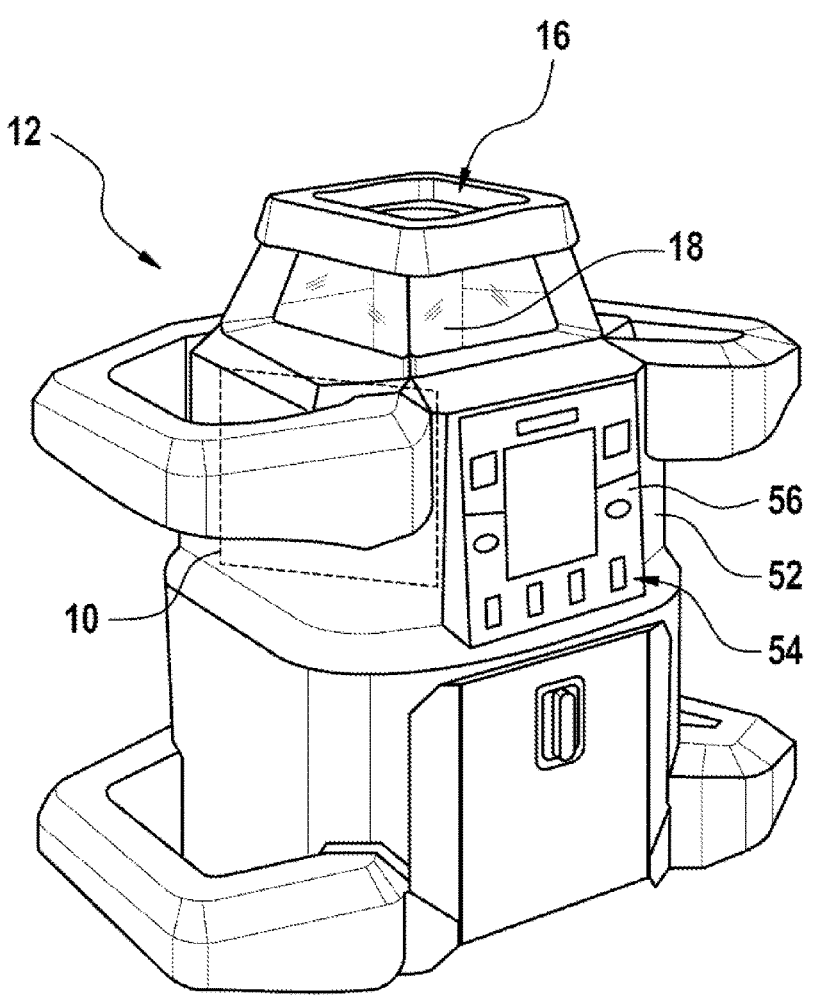
FIG. 1 a rotating laser according to the disclosure with a control and monitoring device according to the disclosure in a representation, FIG. 2 the rotating laser according to the disclosure with the control and monitoring device according to the disclosure, and FIG. 3 a schematic sequence of a method according to the disclosure for operating the control and monitoring device according to the disclosure.

FIG. 1 shows a rotating laser 12 with at least one laser unit 16, with at least one rotating head 18, with at least one drive unit 32 for driving the rotating head 18, and with at least one control and monitoring device 10. The drive unit 32 is designed as an electric motor or the like. The laser unit 16 is arranged on the rotating head 18. The laser unit 16 is arranged on the rotating head 18 in such a way that a rotation of the rotating head 18 rotates a laser beam that can be emitted by means of the laser unit 16, in particular about an axis of rotation (not shown here) of the rotating head 18. The rotating laser 12 comprises at least one housing 52, on, in particular in, which the laser unit 16, the rotating head 18 and/or the drive unit 32 (cf. FIG. 2) are/is arranged. The rotating laser 12 comprises a leveling unit (not shown here) for orienting the rotating head 18 and/or the laser unit 16. The leveling unit comprises at least one sensor (not shown here), for example an acceleration sensor or the like, in order to determine a position, in particular an inclination, of the rotating head 18 and/or of the laser unit 16 relative to a perpendicular. The leveling unit comprises at least one actuator (not shown here) in order to orient the laser unit 16 and/or the rotating head 18, in particular as a function of a position determined by means of the sensor, preferably an inclination, of the laser unit 16 and/or of the rotating head 18 relative to the perpendicular.

Figure 2:
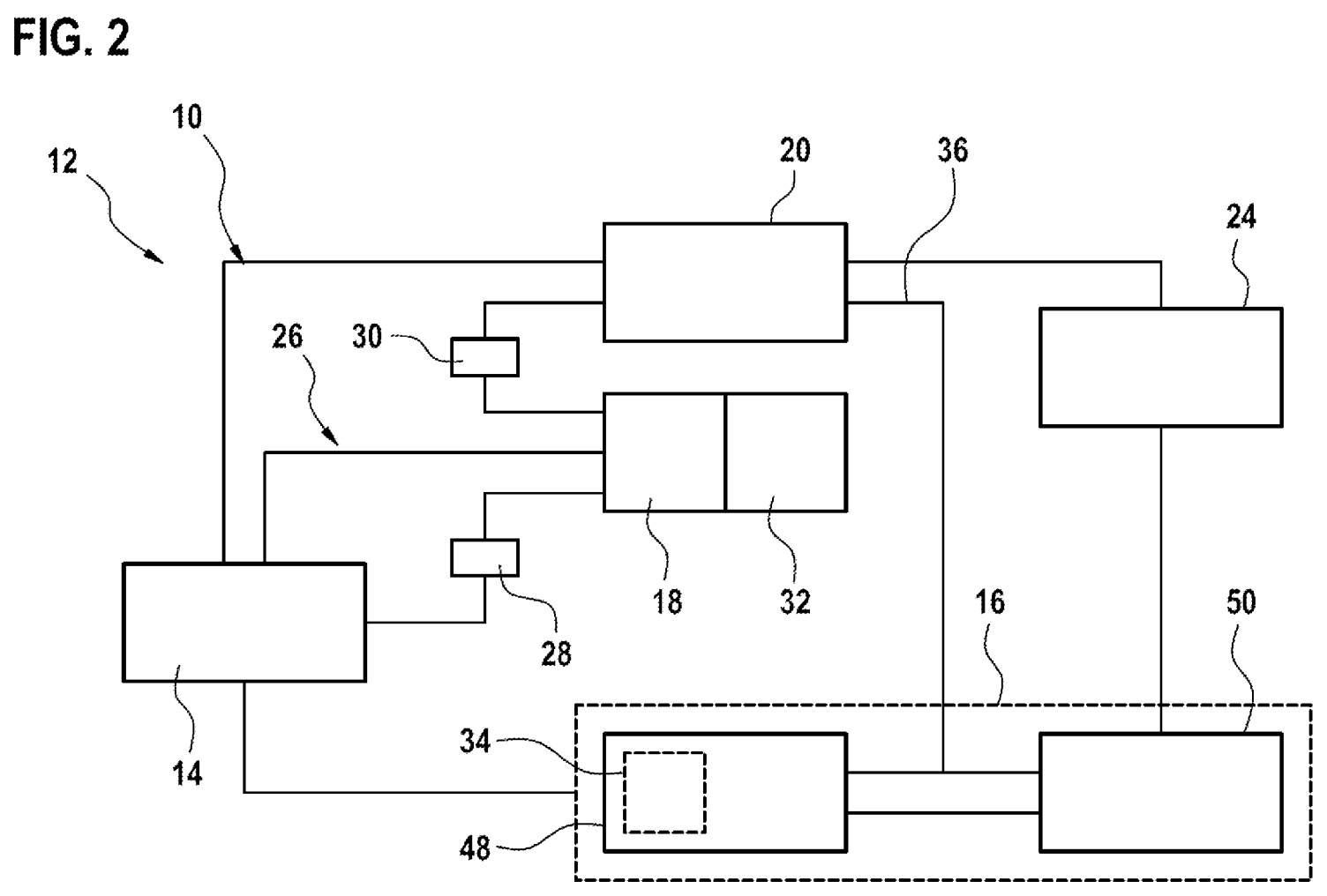

FIG. 2 shows a schematic structure of the rotating laser 12 and of the control and monitoring device 10. The control and monitoring device 10 is configured to control a laser power of the laser unit 16 as a function of an operating mode, in particular a rotational speed, preferably an instantaneous rotational speed, of the rotating head 18 of the rotating laser 12. The control and monitoring device 10 comprises at least one control or regulating unit 14, which is configured to control the laser power, in particular the target laser power, of the laser unit 16 as a function of a rotational speed, in particular an instantaneous rotational speed, of the rotating head 18. The control or regulating unit 14 comprises at least one processor (not shown here) and one memory element (not shown here) as well as an operating program stored on the memory element. The memory element is designed as a digital storage medium, for example a hard drive or the like. The control or regulating unit 14 is designed as a microcontroller or as another control or regulating unit that appears expedient to a person skilled in the art. The control or regulating unit 14 is designed to control or regulate the rotational speed of the rotating head 18, in particular by controlling or regulating the drive unit 32. For example, the rotating laser 12 or the control and monitoring device 10 comprises an input unit 54, which is connected to the control or regulating unit 14 by control or regulation technology, preferably by data technology, in particular in a wired manner. Alternatively, it is also conceivable that input unit 54 is wirelessly connected to the control or regulating unit 14 by control or regulation technology. The input unit 54 comprises at least one keypad 56. Alternatively, it is also conceivable that the input unit 54 comprises a control dial, a touch screen, a slider, a remote control, or the like. A user can input a rotational speed, in particular a target rotational speed, for the rotating head 18 via the input unit 54. It is also conceivable that the rotational speed is controlled automatically.

The control or regulating unit 14 is configured to interrogate and/or determine the rotational speed, in particular the instantaneous rotational speed, of the rotating head 18. It is conceivable that the control or regulating unit 14 is configured to interrogate and/or determined the rotational speed, in particular the instantaneous rotational speed, of the rotating head 18 directly at the rotating head 18 or to determine it as a function of a rotational speed, in particular an instantaneous rotational speed, of the drive unit 32 interrogated by means of the control or regulating unit 14. As a function a rotational speed, in particular an instantaneous rotational speed, of the rotating head 18, in particular as a function of a rotational speed, in particular an instantaneous rotational speed, of the drive unit 32, an operating mode of the rotating head 18 can be determined. The operating mode of the rotating head 18 may be a stoppage of the rotating head 18, a rotation of the rotating head 18 at different rotational speeds, e.g., 150 rpm, 300 rpm, 600 rpm, 1200 rpm, or other rotational speeds, i.e., rotational speeds that appear expedient to a person skilled in the art, a rotation direction of a rotation of the rotating head 18, or the like. The control or regulating unit 14 is configured to set a laser power, in particular a target laser power, of the laser unit 16 as a function of the determined rotational speed, in particular the instantaneous rotational speed, preferably of the determined operating mode, of the rotating head 18. Alternatively, it is also conceivable that the control or regulating unit 14 is configured to set the laser power, in particular the target laser power, directly as a function of a setting made for the rotational speed, in particular the target rotational speed, of the rotating head 18.

The rotating laser 12 comprises at least one sensor unit 26 comprising at least two movement sensors 28, 30, which are in particular different from one another and are arranged on the drive unit 32 or on the rotating head 18 in order to detect a rotational speed, in particular an instantaneous rotational speed, of the rotating head 18. The control or regulating unit 14 is configured to interrogate a sensor signal of a movement sensor 28 of the two movement sensors 28, 30, wherein the operating mode, in particular an operating mode defined by a rotational speed and/or by a rotation direction, of the rotating head 18 can be determined by the control or regulating unit 14 as a function of an evaluation of a temporal change of the sensor signal of the movement sensor 28 interrogated by the control or regulating unit 14.

The control or regulating unit 14 is configured to set a laser power, in particular a target laser power, of the laser unit 16 as a function of the determined rotational speed, in particular the instantaneous rotational speed, of the rotating head 18 in such a way that a maximum value of the laser power is within a target limit value range, which is stored in the memory element of the control or regulating unit 14, for the laser power at the corresponding rotational speed, in particular the instantaneous rotational speed, of the rotating head 18. The target limit value range for the laser power depends on a rotational speed, in particular an instantaneous rotational speed, of the rotating head 18, in particular on the operating mode of the rotating head 18. For example, the target limit value range is predetermined by safety regulations for operating a laser. The input unit 16 comprises at least one laser diode 50. The laser unit 16 comprises at least one driver circuit 48 for exciting the laser diode 50. The driver circuit 48 is configured to electrically excite the laser diode 50. Alternatively, it is conceivable that the driver circuit 48 may be configured to optically pump the laser diode 50. Alternatively, it is also conceivable that the laser unit 16 comprises a gas laser, a dye laser, or a solid-state laser different from the laser diode 50. The driver circuit 48 is designed to be different from the control or regulating unit 14. Alternatively, it is also conceivable that the driver circuit 48 is integrated into the control or regulating unit 14, in particular that the driver circuit 48 and the control or regulating unit 14 are arranged on a common board. Furthermore, it is conceivable that the laser unit 16 comprises at least one laser-power measuring element (not shown here) for detecting a laser power, in particular an instantaneous laser power, of a laser beam that can be emitted by means of the laser unit 16. For example, the laser-power measuring element is designed as a diode. For example, by means of the laser-power measuring element designed as a diode, a laser power, in particular an instantaneous laser power, of the laser beam that can emitted by means of the laser unit 16 can be determined via a photocurrent generated therewith in the diode. It is conceivable that the control or regulating unit 14 is configured to control the laser power, in particular the target laser power, of the laser unit 16 as a function of the laser power detected by means of the laser-power measuring element, in particular the instantaneous laser power, of the laser unit 16.

The control and monitoring device 10 comprises at least one further control or regulating unit 20. The further control or regulating unit 20 is designed as a microcontroller or as another control or regulating unit that appears expedient to a person skilled in the art. The further control or regulating unit 20 is configured to interrogate and adjust, in particular independently of the control or regulating unit 14, the rotational speed, in particular the instantaneous rotational speed, of the rotating head 18 and at least one operating parameter of the laser unit 16 in order to emit a signal for influencing a laser beam that can be emitted by means of the laser unit 16, in particular in order to deactivate the laser unit 16. The control or regulating unit 14 and the further control or regulating unit 20 are arranged in the housing 52 of the rotating laser 12. The further control or regulating unit 20 is designed to be different from the control or regulating unit 14. Alternatively, it is also conceivable that the control or regulating unit 14 and the further control or regulating unit 20 are arranged on a common board. The control or regulating unit 14 and the further control or regulating unit 20 comprise operating programs different from one another. The further control or regulating unit 20 is provided to interrogate and/or determine the rotational speed, in particular the instantaneous rotational speed, of the rotating head 18. It is conceivable that the further control or regulating unit 20 is configured to interrogate the rotational speed, in particular the instantaneous rotational speed, of the rotating head 18 directly at the rotating head 18 or to determine it by means of the further control or regulating unit 20 as a function of an interrogation of the rotational speed, in particular the instantaneous rotational speed, of the drive unit 32. The further control or regulating unit 20 is configured to determine the rotational speed, in particular the instantaneous rotational speed, of the rotating head 18 independently of the control or regulating unit 14. The further control or regulating unit 20 is configured to interrogate a sensor signal of a further movement sensor 30 of the two movement sensors 28, 30, wherein the operating mode, in particular an operating mode defined by a rotational speed, in particular an instantaneous rotational speed, and/or by a rotation direction, of the rotating head 18 can be determined by the further control or regulating unit 20 as a function of an evaluation of a temporal change of the sensor signal of the further movement sensor 30 interrogated by the further control or regulating unit 20. The movement sensor 28 is designed to be different from the further movement sensor 30. The movement sensor 28 and the further movement sensor 30 are based on different measurement methods for detecting a rotational speed, in particular an instantaneous rotational speed. Alternatively, it is also conceivable that the movement sensor 28 and the further movement sensor 30 are designed identically, in particular based on identical measurement methods for detecting a rotational speed, in particular an instantaneous rotational speed. The movement sensor 28 and/or the further movement sensor 30 are/is, for example, designed as optical encoders, as magnetic field sensor(s), or the like. Alternatively, it is also conceivable that the movement sensor 28 and/or the further movement sensor 30 are/is designed as acoustic sensor(s) or as other sensor(s) that appear expedient to a person skilled in the art to detect a rotational speed, in particular an instantaneous rotational speed. The sensor unit 26, in particular the movement sensor 28 and/or the further movement sensor 30, is/are arranged on the drive unit 32 and/or on the rotating head 18.

The further control or regulating unit 20 is connected to the laser unit 16 by control or regulation technology, preferably by data technology, in a wired or wireless manner. The control and monitoring device 10 comprises at least one connection unit 36 that connects the further control or regulating unit 20 to the laser unit 16 by control or regulation technology for the purpose of interrogating the at least one operating parameter of the laser unit 16. The connection unit 36 is provided for a wired connection of the further control or regulating unit 20 to the laser unit 16, in particular to the driver circuit 48 and/or the laser diode 50. The connection unit 36 comprises at least one connection element designed, for example, as a cable, a plug, a socket, or the like, in order to establish a connection by control or regulation technology between the further control or regulating unit 20 and the laser unit 16. Alternatively or additionally, it is also conceivable that the connection unit 36 is provided for a wireless connection of the further control or regulating unit 20 to the laser unit 16, in particular the driver circuit 48 and/or the laser diode 50. For example, a respective transceiver or the like of the connection unit 36 is arranged on the further control or regulating unit 20 and on the laser unit 16, which transceivers are in particular provided to communicate with one another in order to control or regulate the laser unit 16 and/or to transmit the at least one operating parameter of the laser unit 16.

The further control or regulating unit 20 is provided to determine a laser power, in particular a target laser power and/or an instantaneous laser power, of the laser unit 16 as a function of the at least one operating parameter of the laser unit 16. The further control or regulating unit 20 is provided to adjust the laser power interrogated and/or determined by means of the further control or regulating unit 20, in particular the target laser power and/or the instantaneous laser power, of the laser unit 16 with the rotational speed interrogated and/or determined by means of the further control or regulating unit 20, in particular the instantaneous rotational speed, of the rotating head 18. The further control or regulating unit 20 is provided to check whether a maximum value of the laser power interrogated and/or determined by means of the further control or regulating unit 20, in particular the target laser power and/or the instantaneous laser power, of the laser unit 16 is within the target limit value range, which is in particular stored in a memory element (not shown here) of the further control or regulating unit 20, for the laser power at the corresponding rotational speed, in particular the instantaneous rotational speed, of the rotating head 18. The further control or regulating unit 20 is provided to emit the signal for influencing a laser beam that can be emitted by means of the laser unit 16 if a maximum value of the laser power determined by means of the further control or regulating unit 20, in particular the target laser power and/or the instantaneous laser power, of the laser beam that can be emitted by means of the laser unit 16 is outside the target limit value range for the laser power at the corresponding rotational speed, in particular the instantaneous rotational speed, of the rotating head 18.

The at least one operating parameter of the laser unit 16 is designed as a laser power setting made by the control or regulating unit 14, in particular a target laser power, or as a laser power that can be emitted by the laser unit 16, in particular an instantaneous laser power. Alternatively or additionally, it is also conceivable that the at least one operating parameter is an actual operating parameter of the laser unit 16 or the like. It is conceivable that the further control or regulating unit 20 is provided to interrogate the laser power detected by means of the laser-power measuring element, in particular the instantaneous laser power, of the laser beam that can be emitted by means of the laser unit 16. Additionally or alternatively, it is also conceivable that the further control or regulating unit 20 comprises a further laser-power measuring element (not shown here), e.g., a further diode or the like, for detecting a laser power, in particular an instantaneous laser power, of a laser beam that can be emitted by means of the laser unit 16. The laser power setting made by the control or regulating unit 14 is, for example, a control or regulated voltage, digital control or regulation information, or the like.

The signal for influencing a laser beam that can be emitted by means of the laser unit 16 is a signal to control or regulate the laser unit 16, in particular the driver circuit 48 of the laser unit 16, and/or a signal for directly influencing the laser beam that can be emitted by means of the laser unit 16. A signal for directly influencing a laser beam that can be emitted by means of the laser unit 16 is a signal for activating a blocking and/or deflection unit 24 of the control and monitoring device 10 to block and/or deflect the laser beam or the like. Alternatively or additionally, it is also conceivable that the signal for influencing a laser beam that can be emitted by means of the laser unit 16 is a signal for controlling or regulating a power supply (not shown here) of the laser unit 16 and/or of the laser diode 50. The signal for influencing the laser beam that can be emitted by means of the laser unit 16 is provided to change, preferably to reduce, a laser power, in particular a target laser power and/or an instantaneous laser power, of the laser unit 16, to switch off the laser unit 16, and/or to counteract a propagation of the laser beam that can be emitted by means of the laser unit 16. The signal for influencing the laser beam that can be emitted by means of the laser unit 16 is provided to change, preferably to reduce, alternatively or additionally to increase, the laser power, in particular the target laser power and/or an instantaneous laser power, in such a way that a maximum value of the laser power, in particular of the instantaneous laser power, is within the target limit value range for the laser power at the corresponding rotational speed, in particular the instantaneous rotational speed, of the rotating head 18. It is conceivable that the further control or regulating unit 20 is provided to emit the signal for influencing a laser beam that can be emitted by means of the laser unit 16 as a function of only one operating parameter of the laser unit 16 or of a plurality of operating parameters of the laser unit 16.

The control and monitoring device 10 comprises at least the blocking and/or deflection unit 24 for blocking and/or deflecting the laser beam that can be emitted by means of the laser unit 16, which blocking and/or deflection unit can be activated by the signal that can be emitted by the further control or regulating unit 20. The further control or regulating unit 20 is connected to the blocking and/or deflection unit 24 by control or regulation technology, in particular by data technology, for example in a wireless or wired manner, preferably in order to transfer the signal for influencing the laser beam that can be emitted by means of the laser unit 16, to the blocking and/or deflection unit 24 in order to control or regulate the blocking and/or deflection unit 24. The blocking and/or deflection unit 24 comprises at least one blocking element (not shown here) and/or at least one deflection element (not shown here). The blocking element is, for example, designed as a flap, as an aperture, or as another element that appears expedient to a person skilled in the art to block a laser beam. For example, the deflection element is designed as a mirror, as a prism, or as another element that appears expedient to a person skilled in the art to deflect a laser beam. The blocking and/or deflection unit 24 is provided to bloc and/or deflect the laser beam that can be emitted by means of the laser unit 16, in particular by means of the at least one deflection element and/or the at least one blocking element, in an activated state of the blocking and/or deflection unit 24 in such a way that the laser beam is prevented from radiating to an environment of the rotating laser 12. The blocking and/or deflection unit 24, in particular the at least one blocking element and/or the at least one deflection element, are arranged on the laser unit 16, preferably on the laser diode 50 of the laser unit 16. It is also conceivable that the control and monitoring device 10 is designed without a blocking and/or deflection unit 24.

Figure 3:
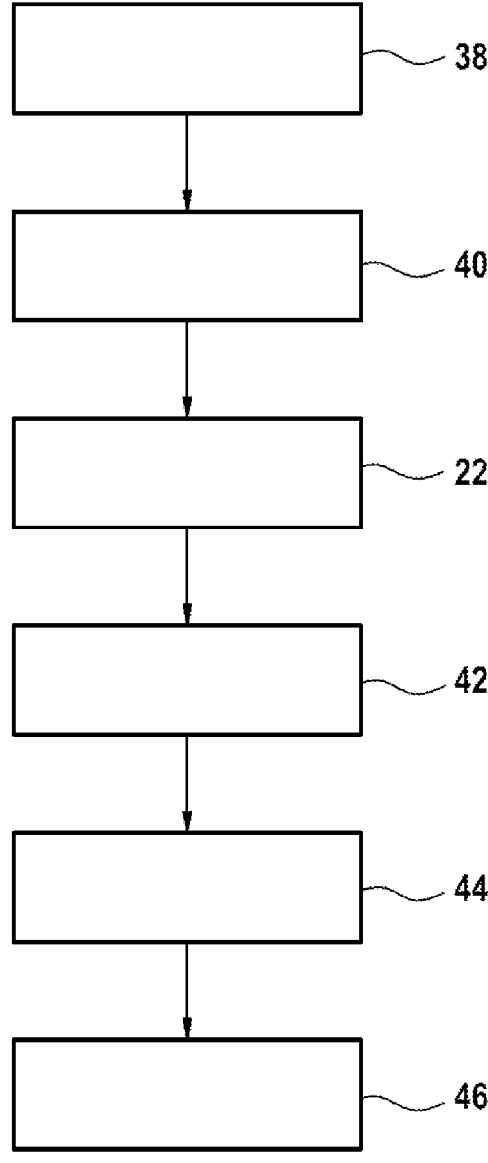

FIG. 3 shows a schematic sequence of a method for operating the control and monitoring device 10 for the rotating laser 12. In particular in a method step 38, the rotational speed, in particular the target rotational speed, of the rotating head 18 is controlled or regulated by means of the control or regulating unit 14, preferably via a control or regulation of the drive unit 32 by the control or regulating unit 14. A rotational speed, in particular a target rotational speed, of the rotating head 18 is set via the input unit 54. For example, a rotational speed, in particular a target rotational speed, of the rotating head 18 is set by an input of a user via the input unit 54. It is alternatively also conceivable that the rotational speed of the rotating head 18 is automatically set. In particular in a further method step 40, the rotational speed, in particular the instantaneous rotational speed, of the rotating head 18 is interrogated and/or determined by means of the control or regulating unit 14.

In a method step 22, a laser power, in particular a target laser power, of the laser unit 16 is controlled by means of the control or regulating unit 14 as a function of a rotational speed, in particular an instantaneous rotational speed, of the rotating head 18. A laser power, in particular a target laser power, of the laser unit 16 is set by means of the control or regulating unit 14 as a function of the determined rotational speed, in particular the instantaneous rotational speed, preferably the determined operating mode, of the rotating head 18. Alternatively, it is also conceivable that the laser power, in particular a target laser power, of the laser unit 16 is set by means of the control or regulating unit 14 directly as a function of a setting made for the rotational speed, in particular the target rotational speed, of the rotating head 18. The laser power, in particular the target laser power, of the laser unit 16 is set by means of the control or regulating unit 14 as a function of the determined rotational speed, in particular the instantaneous rotational speed, of the rotating head 18 in such a way that a maximum value of the laser power is within the target limit value range for the laser power at the corresponding rotational speed, in particular the instantaneous rotational speed, of the rotating head 18. It is additionally or alternatively conceivable that the control or regulating unit 14 controls the laser power, in particular the target laser power, of the laser unit 16 as a function of the laser power detected by means of the laser-power measuring element, in particular the instantaneous laser power, of the laser unit 16.

By means of the further control or regulating unit 20, the rotational speed, in particular the instantaneous rotational speed, of the rotating head 18 and at least one operating parameter of the laser unit 16 is interrogated and adjusted in order to emit the signal for influencing a laser beam that can be emitted by means of the laser unit 16. A sensor signal of the movement sensor 28 of the sensor unit 26 is interrogated by means of the control or regulating unit 14 in particular in the method step 40, and a sensor signal of the further movement sensor 30 of the sensor unit 26 is interrogated by means of the further control or regulating unit 20 in particular in a method step 42, wherein an operating mode, in particular an operating mode defined by a rotational speed and/or by a rotation direction, of the rotating head 18 is determined as a function of an evaluation of a temporal change of the sensor signal of the movement sensor 28 interrogated by the control or regulating unit 14 in particular in the method step 40, and of the sensor signal of the further movement sensor 30 interrogated by the further control or regulating unit 20 in particular in the method step 42. The rotational speed, in particular the instantaneous rotational speed, of the rotating head 18 is determined by means of the further control or regulating unit 20 independently of the control or regulating unit 14. The operating mode, in particular the rotational speed, preferably the instantaneous rotational speed, of the rotating head 18 is determined as a function of an evaluation of a temporal change of the sensor signal of the movement sensor 28 interrogated by the control or regulating unit 14, independently of a determination of the operating mode, in particular of the rotational speed, of the rotating head 18 as a function of an evaluation of a temporal change of the sensor signal of the further movement sensor 30 interrogated by the further control or regulating unit 20.

An operating parameter of the laser unit 16 designed as a laser power setting made by the control or regulating unit 14, in particular a target laser power, or a laser power that can be emitted by the laser unit 16, in particular an instantaneous laser power, is interrogated by means of the further control or regulating unit 20. By means of the further control or regulating unit 20, a laser power, in particular a target laser power and/or an instantaneous laser power, of the laser unit 16 is determined as a function of the at least one operating parameter of the laser unit 16 in particular in a method step 44. The further control or regulating unit 20 adjusts the laser power interrogated and/or determined by means of the further control or regulating unit 20, in particular the target laser power and/or the instantaneous laser power, of the laser unit 16 with the rotational speed interrogated and/or determined by means of the further control or regulating unit 20, in particular the instantaneous rotational speed, of the rotating head 18. The further control or regulating unit 20 checks whether a maximum value of the laser power interrogated and/or determined by means of the further control or regulating unit 20, in particular the target laser power and/or the instantaneous laser power, of the laser unit 16 is within the target limit value range for the laser power at the corresponding rotational speed, in particular the instantaneous rotational speed, of the rotating head 18. The signal for influencing a laser beam that can be emitted by means of the laser unit 16 is emitted by means of the further control or regulating unit 20 in particular in a method step 46 if a maximum value of the laser power determined by means of the further control or regulating unit 20, in particular the target laser power and/or the instantaneous laser power, of the laser beam that can be emitted by means of the laser unit 16 is outside the target limit value range for the laser power at the corresponding rotational speed, in particular the instantaneous rotational speed, of the rotating head 18. By means of the signal for influencing a laser beam that can be emitted by means of the laser unit 16, a laser power, in particular a target laser power and/or an instantaneous laser power, of the laser unit 16, is changed, preferably reduced, the laser unit 16 is deactivated and/or a propagation of the laser beam that can be emitted by means of the laser unit 16 is counteracted. By means of the signal for influencing the laser beam that can be emitted by means of the laser unit 16, the laser power, in particular the target laser power and/or the instantaneous laser power, is changed, e.g., reduced or increased, in such a way that a maximum value of the laser power, in particular of the instantaneous laser power, is within the target limit value range for the laser power at the corresponding rotational speed, in particular the instantaneous rotational speed, of the rotating head 18.

Alternatively or additionally, the blocking and/or deflection unit 24 is activated to block and/or deflect the laser beam that can be emitted by means of the laser unit 16, in particular in the method step 46, as a function of the signal that can be emitted by means of the further control or regulating unit 20. For example, as a function of the signal that can be emitted by means of the further control or regulating unit 20 in order to influence the laser beam that can be emitted by means of the laser unit 16, the at least one blocking element is brought into a beam path of the laser beam that can be emitted by means of the laser unit 16, in order to block the laser beam. For example, alternatively or additionally, as a function of the signal that can be emitted by means of the further control or regulating unit 20 in order to influence the laser beam that can be emitted by means of the laser unit 16, the at least one deflection element is brought into the beam path of the laser beam that can be emitted by means of the laser unit 16, in order to deflect the laser beam.

Alternatively or additionally, at least one operating parameter, in particular an instantaneous operating parameter, of the control or regulating unit 14 is interrogated by means of the further control or regulating unit 20 in particular in the method step 44 in order to emit, by means of the further control or regulating unit 20, the signal for influencing the laser beam that can be emitted by means of the laser unit 16, at least as a function of the at least one operating parameter, in particular the instantaneous operating parameter, of the control or regulating unit 14. It is conceivable that the signal for influencing a laser beam that can be emitted by means of the laser unit 16 depends on the at least one operating parameter of the laser unit 16, additionally or alternatively on the at least one operating parameter of the control or regulating unit 14. The at least one operating parameter of the control or regulating unit 14 is an operating parameter affecting the laser power, in particular the instantaneous laser power, in particular an instantaneous operating parameter, of the control or regulating unit 14. It is furthermore conceivable that the signal for influencing a laser beam that can be emitted by means of the laser unit 16 alternatively or additionally depends on at least one further operating parameter, in particular an instantaneous operating parameter, of a further component of the control and monitoring device 10 and/or of a further component of the rotating laser 12, wherein the further operating parameter in particular influences a laser power that can be emitted by means of the laser unit 16, in particular the instantaneous laser power, e.g., an operating parameter of a voltage supply or the like.

Furthermore, alternatively or additionally, at least one operating parameter, in particular a voltage characteristic variable, of an amplifier 34, in particular of an operational amplifier, of the laser unit 16 is interrogated by means of the further control or regulating unit 20 in order to emit, by means of the further control or regulating unit 20, at least as a function of the at least one operating parameter of the amplifier 34, the signal for influencing the laser beam that can be emitted by means of the laser unit 16. It is conceivable that the signal for influencing a laser beam that can be emitted by means of the laser unit 16 depends on the operating parameter of the laser unit 16 designed as a laser power setting made by the control or regulating unit 14, in particular a target laser power, or as a laser power that can be emitted by the laser unit 16, in particular the instantaneous laser power, additionally or alternatively on the at least one operating parameter of the amplifier 34 and/or on the at least one operating parameter of the control or regulating unit 14. It is also conceivable that the signal for influencing the signal that can be emitted by means of the laser unit 16 depends only on the operating parameter of the laser unit 16 designed as a laser power setting made by the control or regulating unit 14, in particular a target laser power, on the operating parameter of the laser unit 16 designed as a laser power that can be emitted by the laser unit 16, in particular an instantaneous laser power, on the at least one operating parameter of the control or regulating unit 14 or only on the at least one operating parameter of the amplifier 34 of the laser unit 16. The voltage characteristic variable is a voltage level or the like. The voltage characteristic variable is measured at an output of the amplifier 34. It is conceivable that amplifier 34 is implemented as an integrated circuit. A laser power, in particular an instantaneous laser power, of a laser beam that can be emitted by means of the laser unit 16 depends on the voltage characteristic variable, in particular the voltage level, preferably at the output, of the amplifier 34.

What is claimed is:

1. A method for operating a control and monitoring device for a rotating laser, comprising:

controlling a laser power of a laser unit of the rotating laser, using a control or regulating unit of the control and monitoring device, as a function of a rotational speed of a rotating head of the rotating laser;

interrogating the rotational speed of the rotating head and at least one operating parameter of the laser unit using a further control or regulating unit of the control and monitoring device; and emitting with the further control or regulating unit a signal which influences a laser beam emitted by the laser unit based upon the interrogation.

2. The method according to claim 1, wherein the at least one operating parameter is at least one of a laser power setting made by the control or regulating unit, and an operating parameter of the laser unit designed as a laser power emitted by the laser unit.

3. The method according to claim 1, further comprising:

activating a blocking and/or deflection unit of the control and monitoring device to block or deflect the laser beam emitted by the laser unit, as a function of the at least one signal emitted using the further control or regulating unit.

4. The method according to claim 1, wherein at least one of the at least one signal is a function of the at least one operating parameter of the control or regulating unit.

5. The method according to claim 1, wherein:

a sensor signal of a movement sensor of a sensor unit of the rotating laser is interrogated using the control or regulating unit;

interrogating the rotational speed of the rotating head comprises interrogating a sensor signal of a further movement sensor of the sensor unit; and an operating mode defined by a rotational speed and/or by a rotation direction, of the rotating head, is determined as a function of an evaluation of a temporal change of the sensor signals interrogated by the control or regulating unit and the further control or regulating unit.

6. The method according to claim 1, wherein at least one voltage characteristic variable, of an operational amplifier, of the laser unit is interrogated by using the further control or regulating unit to emit, using the further control or regulating unit, at least as a function of the at least one voltage characteristic variable of the operational amplifier, the at least one signal influencing the laser beam emitted by the laser unit.

7. A control and monitoring device for a rotating laser, configured to control a laser power of a laser unit of the rotating laser as a function of an operating mode of a rotating head of the rotating laser, comprising:

at least one control or regulating unit configured to control the laser power of the laser unit as a function of a rotational speed of the rotating head; and a further control or regulating unit configured to interrogate, independently of the control or regulating unit, the rotational speed of the rotating head and at least one operating parameter of the laser unit, and to emit a signal that influences a laser beam emitted by the laser unit based upon the interrogation.

8. The control and monitoring device according to claim 7, further comprising:

a connection unit connecting the further control or regulating unit, using control or regulation technology, to the laser unit to interrogate the at least one operating parameter of the laser unit.

9. The control and monitoring device according to claim 7, further comprising:

a blocking and/or deflection unit configured to block and/or deflect the laser beam emitted by the laser unit, which blocking and/or deflection unit is activated by the signal emitted by the further control or regulating unit.

10. A rotating laser, comprising:

at least one laser unit with at least one rotating head, with at least one drive unit configured to drive the rotating head; and at least one control and monitoring device according to claim 7.

11. The rotating laser according to claim 10, further comprising:

a sensor unit comprising at least two movement sensors which are different from one another and which are arranged on the drive unit or on the rotating head and configured to detect a rotational speed of the rotating head.

12. The method of claim 1, wherein the at least one signal comprises:

a first signal which influences the laser power; and a second signal which influences blocking and/or deflecting the laser beam.

* * * * *